US008410598B2

(12) United States Patent
Goh

(10) Patent No.: US 8,410,598 B2
(45) Date of Patent: Apr. 2, 2013

(54) SEMICONDUCTOR PACKAGE AND METHOD OF MANUFACTURING THE SAME

(75) Inventor: Kim-Yong Goh, Singapore (SG)

(73) Assignee: STMicroeletronics Pte. Ltd., Singapore (SG)

( * ) Notice: Subject to any disclaimer, the term of this patent is extended or adjusted under 35 U.S.C. 154(b) by 114 days.

(21) Appl. No.: 12/982,722

(22) Filed: Dec. 30, 2010

(65) Prior Publication Data
US 2012/0168929 A1 Jul. 5, 2012

(51) Int. Cl.
*H01L 23/34* (2006.01)
*H01L 21/60* (2006.01)
*H01L 21/56* (2006.01)

(52) U.S. Cl. ........... 257/692; 257/E23.08; 257/E21.506; 257/E21.503; 257/778; 257/738; 257/737; 257/784; 257/786; 257/774; 257/773; 438/118; 438/122

(58) Field of Classification Search ........... 257/692, 257/E21.506, E21.503, E23.08, 778, 737, 257/738, 784, 786, 774, 773; 438/118, 122
See application file for complete search history.

(56) References Cited

U.S. PATENT DOCUMENTS

| | | | | |
|---|---|---|---|---|
| 5,844,168 | A | * | 12/1998 | Schueller et al. ............. 174/558 |
| 5,909,056 | A | | 6/1999 | Mertol |
| 5,949,137 | A | | 9/1999 | Domadia et al. |
| 6,744,125 | B2 | * | 6/2004 | Camenforte et al. ......... 257/678 |
| 7,193,320 | B2 | * | 3/2007 | Hosoyamada et al. ....... 257/738 |
| 7,508,066 | B2 | * | 3/2009 | Huang et al. .................. 257/707 |
| 7,908,745 | B2 | * | 3/2011 | Sakamoto et al. ............. 29/832 |
| 8,003,496 | B2 | * | 8/2011 | Oh et al. ....................... 438/464 |
| 2008/0315404 | A1 | * | 12/2008 | Eichelberger et al. ........ 257/713 |
| 2011/0068459 | A1 | * | 3/2011 | Pagaila et al. ................. 257/698 |
| 2012/0119388 | A1 | * | 5/2012 | Cho et al. ..................... 257/778 |

* cited by examiner

*Primary Examiner* — A O Williams
(74) *Attorney, Agent, or Firm* — Seed IP Law Group PLLC

(57) ABSTRACT

A semiconductor package is formed having a substrate juxtaposed on at least two sides of a semiconductor die. Both the substrate and the semiconductor die are affixed to a conductive layer that draws heat generated during use of the semiconductor package away from the semiconductor die and the substrate. There are also electrical contacts affixed to the substrate and the semiconductor die. The electrical contacts facilitate electrical connection between the semiconductor die, the substrate, and any external devices or components making use of the semiconductor die. The substrate, semiconductor die, and at least a portion of some of the electrical contacts are enclosed by an encapsulating layer insulating the components. Portions of the electrical contacts not enclosed by the encapsulating layer are affixed to an outside device, such as a printed circuit board.

8 Claims, 7 Drawing Sheets

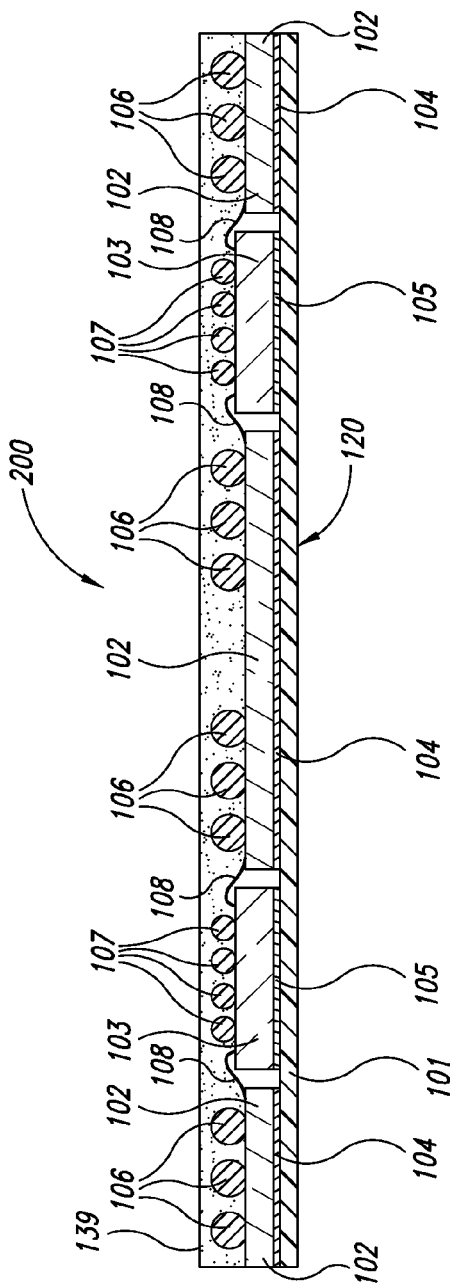
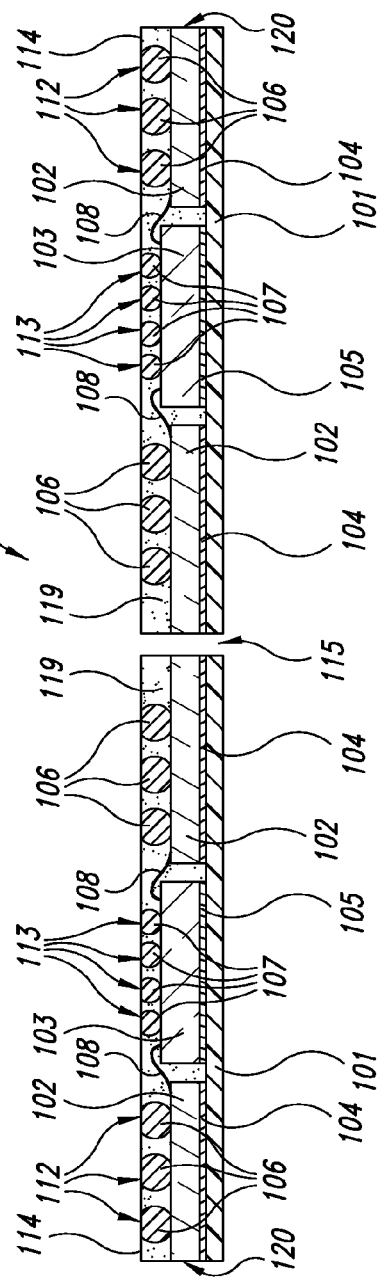
FIG. 6C
FIG. 6D

SEMICONDUCTOR PACKAGE AND METHOD OF MANUFACTURING THE SAME

BACKGROUND

1. Technical Field

This description generally relates to a semiconductor package, such as a hybrid ball grid array, and a method of manufacturing the semiconductor package.

2. Description of the Related Art

A semiconductor die may be packaged to be used in an integrated circuit ("IC"). A semiconductor die is packaged not only to protect it from the elements of the external environment, such as heat, humidity, and even physical damage, but also to provide electrical connections from the semiconductor die to a printed circuit board ("PCB"), for example. The electrical connections generally provided are for input, output, and power to the semiconductor die.

Conventionally, a semiconductor package may include various components, such as the semiconductor die, a leadframe, a substrate, and other electrical connections. The various components in a semiconductor package are connected to each other and to the outside environment using electrical connections. For example, the entire bottom of one type of semiconductor package may be only the substrate. In such an instance, the semiconductor die is connected to the substrate using electrical contacts placed on the opposite side of the substrate than the side that is electrically connected to the outside environment.

To carry signals to and from the semiconductor die to the outside environment, the substrate may have various electrical traces embedded throughout to make connection with the semiconductor die, which is fully contained inside the semiconductor package. Thus, signals entering and leaving the semiconductor die to the outside environment must always travel through the substrate. As a result, the signals will lose some signal strength and be subject to various interferences, such as thermal noise or parasitic inductance and capacitance.

BRIEF SUMMARY

A semiconductor packaging, including a thermally conductive layer used to dissipate heat from the semiconductor package, is disclosed according to one embodiment. A substrate and semiconductor die are affixed to the thermally conductive layer by way of adhesive layers. The substrate and the semiconductor die may have a plurality of electrical contacts formed thereon. Covering the substrate, the semiconductor die, and at least a portion of the plurality of electrical contacts is an encapsulating layer. The encapsulating layer is ground down to expose at least a portion of the plurality of electrical contacts. The plurality of electrical contacts forms electrical connections between the substrate and semiconductor die and couple the semiconductor die to the outside environment.

BRIEF DESCRIPTION OF THE SEVERAL VIEWS OF THE DRAWINGS

The foregoing, including other features and advantages of the present disclosure will be more readily appreciated as the same become better understood from the following detailed description when taken in conjunction with the accompanying drawings.

FIG. 6C is a third cross-sectional view of the manufacturing process of the semiconductor package in which an encapsulating layer is formed enclosing the thermally conductive layer, the substrate, the semiconductor die, and the plurality of electrical contacts.

FIG. 6D is a fourth cross-sectional view of the manufacturing process of the semiconductor package in which the encapsulating layer is ground down to expose at least a portion of some of the plurality of electrical contacts so that the semiconductor package may be affixed to another device, such as the printed circuit board shown in FIG. 2.

DETAILED DESCRIPTION

Figure 1:
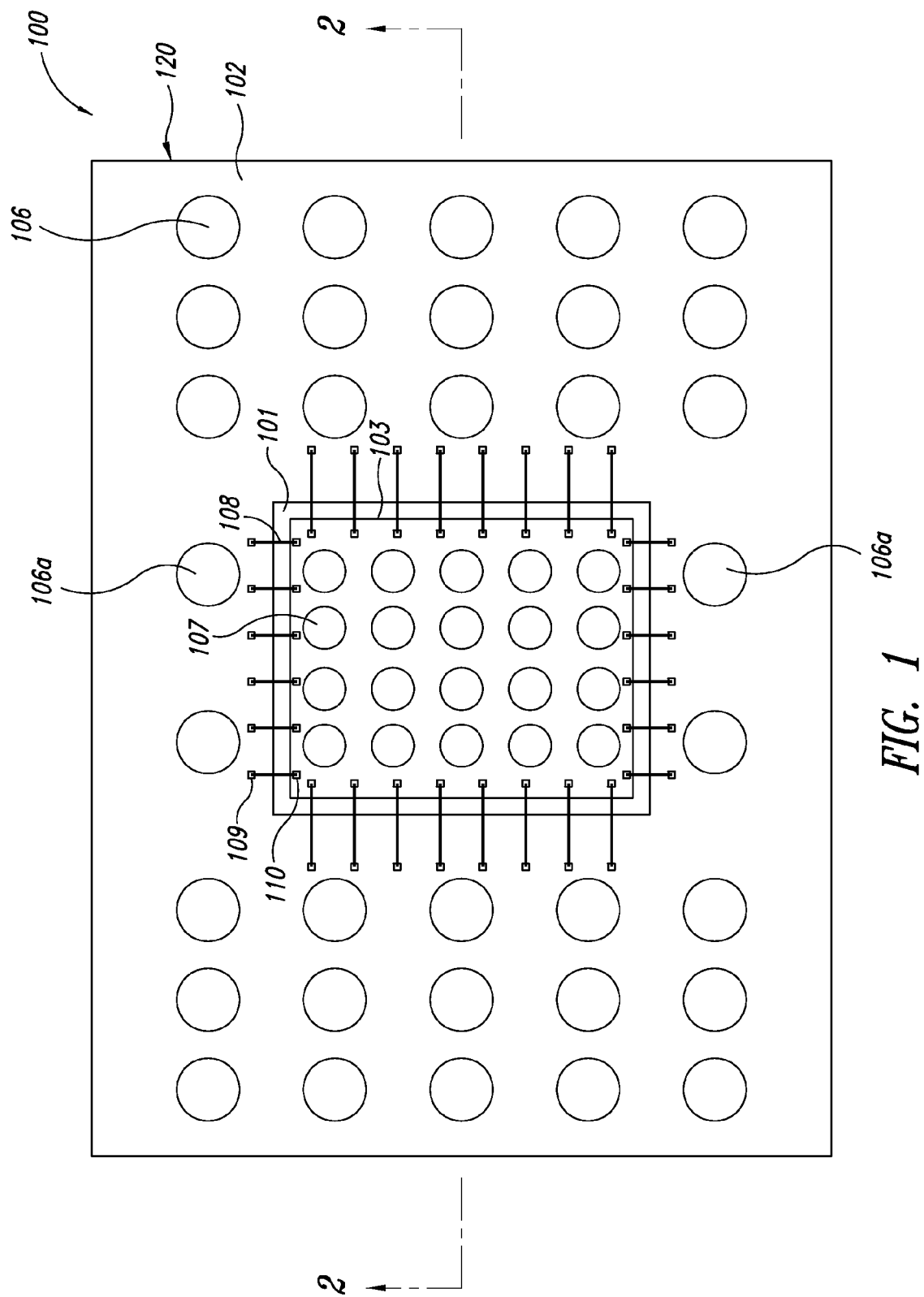
FIG. 1 is a top plan view of a circuit assembly including a semiconductor package according to one embodiment.

In the following description, certain specific details are set forth in order to provide a thorough understanding of various aspects of the disclosure. However, the invention described within the disclosure may be practiced without these specific details. In some instances, well-known structures and methods of forming the structures associated with the semiconductor package have not been described in detail to avoid obscuring the descriptions of the embodiments and aspects of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one aspect," "an aspect," "one embodiment," or "an embodiment" means that a particular feature, structure, or characteristic described in connection with the aspect or embodiment is included in at least one aspect or at least one embodiment. Thus, the appearances of the phrases "in one aspect" or "in an aspect" in various places throughout this specification are not necessarily all referring to the same aspect. Similarly, the phrases "in one embodiment" or "in an embodiment" throughout this specification are not necessarily referring to the same embodiment. Furthermore, the particular features, structures, or characteristics may be combined in any suitable manner in one or more aspects or embodiments of the present disclosure.

In the drawings, identical reference numbers identify similar features or elements. The size and relative positions of features in the drawings are not necessarily drawn to scale.

FIG. 1 shows a top plan view of a circuit assembly 100 with a semiconductor package 120 according to one embodiment of the present disclosure. According to one aspect of the present embodiment, the semiconductor package 120 may be a ball grid array ("BGA") type of semiconductor package. However, other types of semiconductor packages with electrical ball connections, such as solder balls, are also within the scope of the present disclosure. In FIG. 1, the semiconductor package 100 has a thermally conductive layer 101, a substrate 102 and a semiconductor die 103 affixed to the thermally conductive layer 101. The thermally conductive layer 101 is underneath the substrate 102 and the semiconductor die 103.

Figure 2:
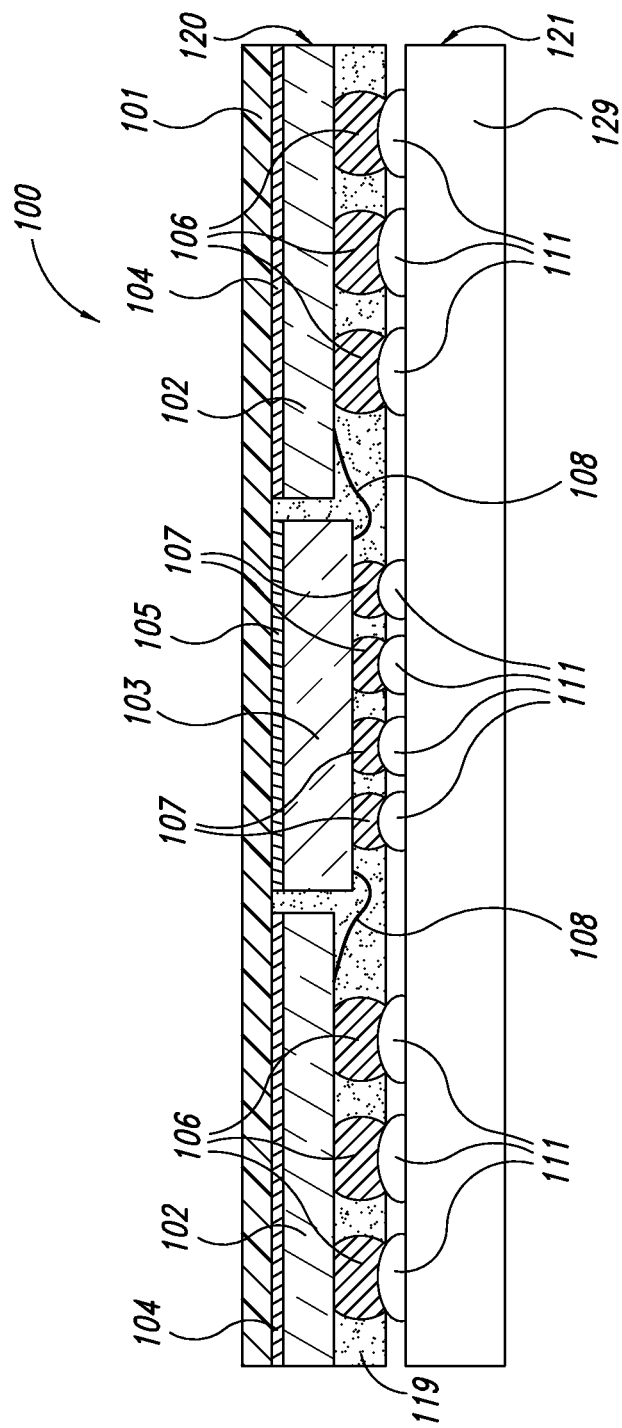
FIG. 2 is a cross-sectional view of the circuit assembly as shown in FIG. 1, taken along line 2-2 of FIG. 1, without the encapsulation layer according to the first embodiment.

The embodiment in FIG. 1 shows the substrate 102 placed around the semiconductor die 103 on at least four sides. The substrate 102 may also be formed, however, in different configurations as discussed with regard to FIGS. 4 and 5. The substrate 102 is electrically connected to the semiconductor die 103 via bonding wires 108. The bonding wires 108 are coupled to the substrate 102 and the semiconductor die 103 via contact pads 109, 110, respectively. Further, formed on the substrate 102 are substrate electrical contacts 106, 106a. Similarly, formed on the semiconductor die 103 are the electrical contacts 107. FIG. 2 should not be construed as a complete semiconductor package 120 according to the present disclosure, but merely a top plan view of inner components of the semiconductor package 120.

FIG. 2 shows a cross-sectional view of the circuit assembly 100, taken along the line 2-2 of FIG. 1. The circuit assembly 100 includes the semiconductor package 120 and a printed circuit board ("PCB") 121. The semiconductor package 120 has the thermally conductive layer 101, the substrate 102, and the semiconductor die 103. The thermally conductive layer 101 is made of a material with good thermal conductive properties, such as a heat sink. As used in this disclosure, a heat sink includes any thermally conductive material that can be attached to the electronic device and used to carry heat away from the inner components like the semiconductor die 103. Examples of a heat sink may include a heat spreader, a heat fin, heat tape, a heat pad, or the like.

The thermally conductive layer 101 is also of sufficient rigidity to support the substrate 102 and the semiconductor die 103. By way of example, the thermally conductive layer 101 may be a metal such as nickel-plated copper that easily conducts heat away from the substrate 102 and the semiconductor die 103, and is also rigid enough to support the semiconductor package 120.

According to the present embodiment, the substrate 102 is attached to the thermally conductive layer 101 using substrate adhesive layers 104. The substrate adhesive layers 104 may be made of a material that has high thermal conductivity that dissipates heat generated from the substrate 102 and the semiconductor die 103 through the thermally conductive layer 101. For example, the substrate adhesive layers 104 may be adhesive tape used to affix a substrate or semiconductor device to another device.

According to another aspect of the present embodiment, the semiconductor die 103 is attached to the thermally conductive layer 101 with a die adhesive layer 105. The die adhesive layer 105 may be made of a material that also has high thermal conductivity and that strongly adheres the semiconductor die 103 to the thermally conductive layer 101. The die adhesive layer 105 may be, for example, adhesive glue used to affix a substrate or semiconductor device to another device. The adhesive glue may be made of an epoxy resin that has high thermal conductivity.

In another aspect of the present embodiment, the substrate adhesive layers 104 and the die adhesive layer 105 may be made of the same type of material, which can include adhesive tape, adhesive glue, or the like. Even so, the substrate adhesive layers 104 and the die adhesive layer 105 are still physically separate when placed on the thermally conductive layer 101, as seen in FIG. 2. In an alternative embodiment, the substrate adhesive layers 104 and the die adhesive layer 105 may be one layer that runs the length of the thermally conductive layer 101. That is to say, instead of the substrate adhesive layers 104 and the die adhesive layer 105 being separate, there would be one adhesive layer.

Further shown in FIG. 2 are substrate electrical contacts 106 formed on the substrate 102. In one aspect of the present disclosure, the substrate electrical contacts 106 (as well as the substrate electrical contacts 106a shown in FIG. 1) may be solder elements, such as solder balls, used to adhere the substrate 102 to another device or devices, such as the PCB 121. Additionally, the substrate electrical contacts 106 provide electrical connections for the substrate 102 to the PCB 121. The substrate electrical contacts 106 may be formed on the substrate 102 using solder paste that temporarily holds the substrate electrical contacts 106 in place before they are soldered. In one aspect, the electrical connections 106 may be soldered into place at the same time that the semiconductor package 120 is electrically and physically coupled to another electrical device, such as the PCB 121.

Additionally, the substrate 102 has electrical traces (not shown) embedded within the substrate material to establish a connection with the substrate electrical contacts 106. The electrical traces embedded within the substrate 102 are made of an electrically conductive material, such as a metal, including gold, copper, aluminum, titanium etc., or other electrically conductive material, such as carbon-based structures, including carbon nanotubes, etc.

The die electrical contacts 107 are formed on the semiconductor die 103, as shown in FIG. 2. As with the substrate electrical contacts 106, the die electrical contacts 107 may be solder elements, such as smaller solder bumps, used to affix the die 103 to another device, such as the PCB 121. The die electrical contacts 107 may also provide electrical connections for the semiconductor die 103 to an external environment. According to the present embodiment, the die electrical contacts 107 are smaller in size than the substrate electrical contacts 106, 106a. One reason for this is that the die electrical contacts 107 are placed on the semiconductor die 103, which may have smaller contact points than the substrates 102, thus requiring smaller electrical contacts.

Similarly, and in addition to the substrate electrical contacts 106, the bonding wires 108 also provide electrical connections for the semiconductor die 103 to the substrate 102, and are coupled to the substrate 102 and the semiconductor die 103 via contact pads 109, 110, respectively. The bonding wires 108 are connected to the substrate 102 and further electrically connected to the substrate electrical contacts 106 via the electrical traces embedded within the substrate 102.

In an alternative embodiment of the present disclosure, there may be no die electrical contacts 107 affixed to the semiconductor die 103 electrically connecting the semiconductor die 103 with the PCB 121. Instead, the semiconductor die 103 establishes electrical connection outside of the semiconductor package 120 solely through connections to the substrate 102 via bonding wires 108. The bonding wires 108 may be made of any type of electrically conductive material, such as metal, that also reduces corrosion and breakage due to mechanical stresses on the material.

As further seen in FIG. 2, the semiconductor package 120 has an encapsulation layer 119, which encloses the substrate 102, the semiconductor die 103, the substrate electrical contacts 106, 106a, the die electrical contacts 107, and the bonding wires 108. The encapsulation layer 119 may be a molding material such as a composite, including an epoxy resin type, a hardener type, a catalyst type, or the like.

Additionally, the encapsulation layer 119 may be thermally conductive to move heat away from the substrate 102 and the semiconductor die 103 during operation. The encapsulation layer 119 may also be electrically insulating to prevent signal degradation for signals carried over the bonding wires 108, the substrate electrical contacts 106, and the die electrical contacts 107. The encapsulating layer 119 may also be flexible and tolerant to mechanical stresses but still provide support to the substrate 102 and the semiconductor die 103.

Also seen in FIG. 2 is the PCB 121, which includes a PCB substrate 129 and PCB electrical contacts 111. The PCB 121 may have other electrical circuits attached to it for performing various tasks, either separate from or in connection with the semiconductor package 120. For example, there may be a separate semiconductor package (not shown) also attached to the PCB 121 for processing graphic or audio signals. The separate semiconductor package may also be connected to the semiconductor package 120 through the PCB 121 so that signals and data may be communicated between the two semiconductor packages as needed.

In one embodiment, the PCB electrical contacts 111 form electrical connections with the substrate electrical contacts 106, 106a and the die electrical contacts 107. In an alternative embodiment, if the semiconductor package 120 does not have the die electrical contacts 107, then the PCB 121 will not have the electrical contacts 111 that make an electrical connection with the die electrical contacts 107. The electrical connections made between the semiconductor package 120 and the PCB 121 may be used to carry signals and power to and from the semiconductor die 103.

According to the present disclosure, the electrical contacts 111 and the die electrical contacts 107 directly connect the semiconductor die 103 to various inputs and outputs from other components on the PCB 121, external devices, and a power supply. In this way, not all signals have to travel through the substrate 102 and into the semiconductor die 103 via bonding wires 108. Such a configuration reduces the electrical signal path length, which increases signal reliability and decreases thermal impairments, such as interference. Additionally, placing the semiconductor die 103 between the substrates 102 decreases the thickness of the circuit assembly 100.

Figure 3:
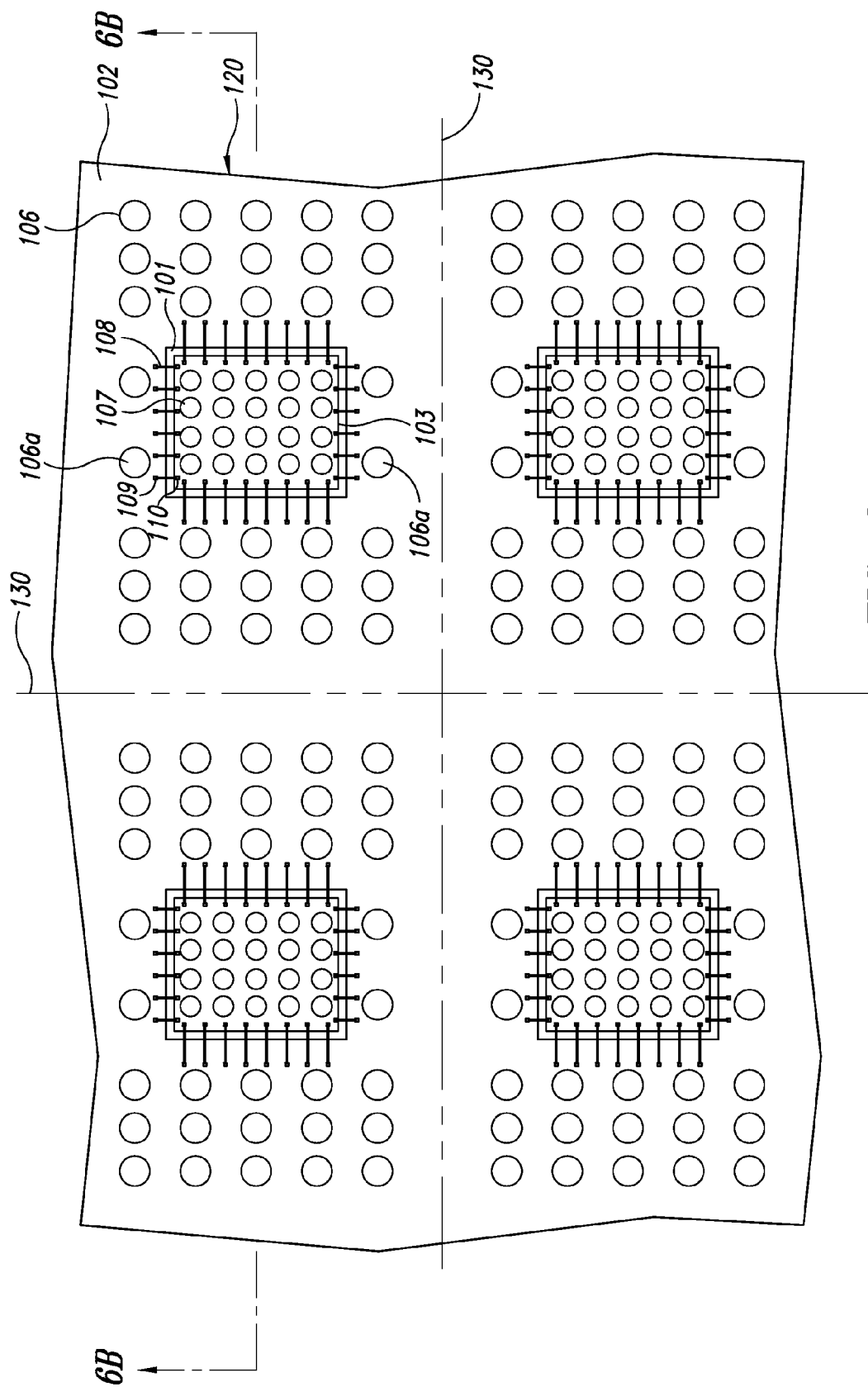
FIG. 3 is a top plan view of a set of circuit assemblies, such as the circuit assembly shown in FIG. 1, without the encapsulation layer.

In another aspect of the present embodiment, FIG. 3 shows a plurality of the semiconductor packages 120 being formed. Each semiconductor package 120 has the thermally conductive layer 101, the substrate 102, the semiconductor die 103, the substrate electrical contacts 106, 106a, the die electrical contacts 107, the bonding wires 108, and the contact pads 109, 110. In an alternative embodiment, the die electrical contacts 107 are not formed on each of the plurality of semiconductor dies 103. Thus, each of the semiconductor dies 103 is electrically connected solely through the bonding wires 108 and the substrate electrical contacts 106, 106a. Further, after the plurality of semiconductor packages 120 are formed (as discussed with regard to FIGS. 6A-6D), each semiconductor package 120 is cut along singulation lines 130. FIG. 3 does not show the encapsulation layer 109, thus it should not be construed as showing a complete plurality of semiconductor packages 120 according to the present disclosure.

Figure 4:
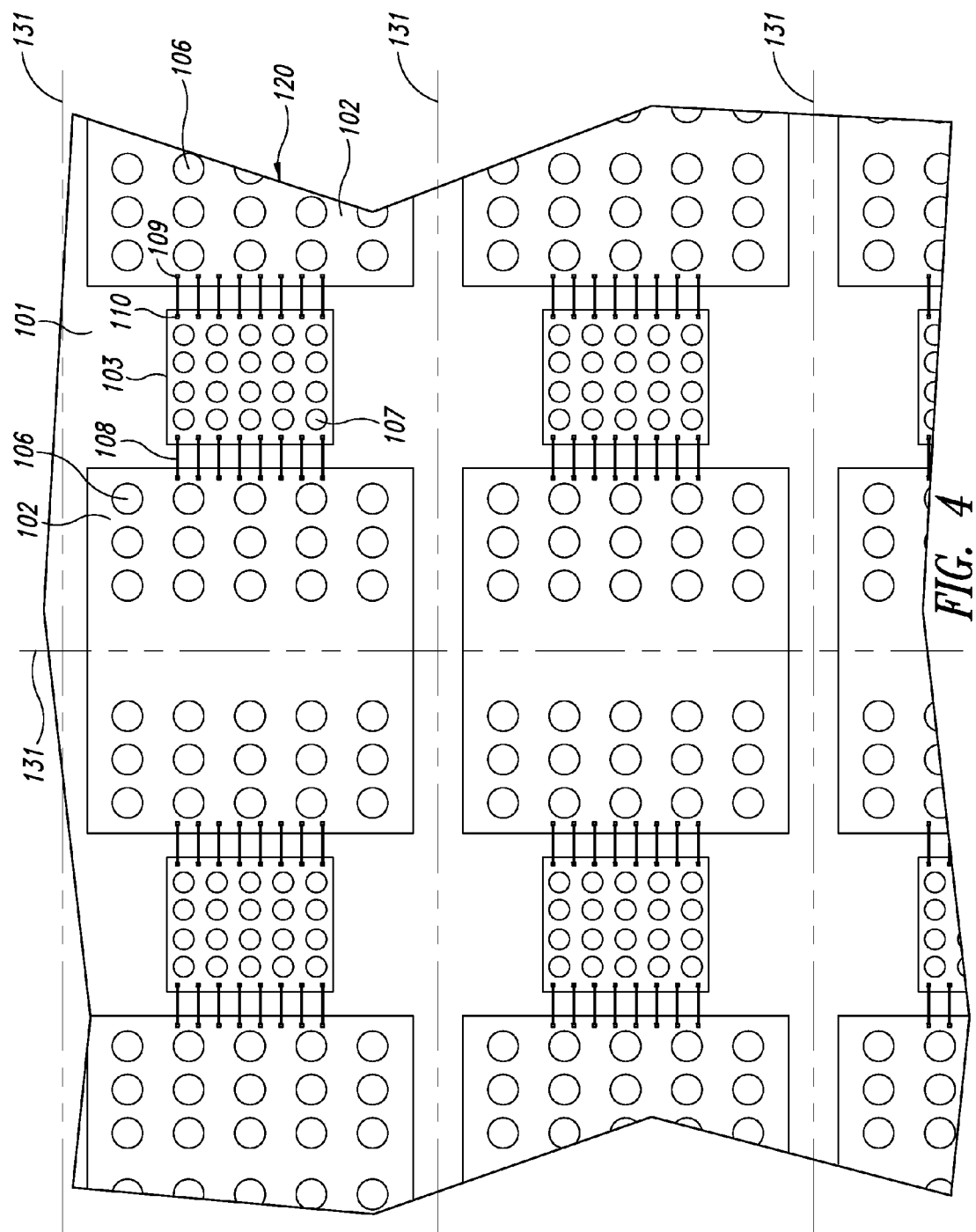
FIG. 4 is a top plan view of a set of circuit assemblies, without the encapsulation layer, according to a second embodiment.

FIG. 4 shows another embodiment of the present disclosure with one semiconductor package 120 being formed on a sheet of a plurality of semiconductor packages 120. As seen in FIG. 4, the substrate 102 is not made of one continuous substrate as seen in FIG. 3. Instead, there are a plurality of substrates 102 that form part of the semiconductor package 120. FIG. 4 further shows the semiconductor die 103 affixed to the thermally conductive layer 101. The substrates 102 are electrically connected to the semiconductor die 103 via the bonding wires 108, which are coupled to the substrates 102 and the semiconductor die 103 via the contact pads 109, 110. There are also substrate electrical contacts 106 affixed to the substrates 102. Since the substrates 102 are not adjacent to the semiconductor die 103 on four sides, the substrate electrical contacts 106a are not formed. Also formed on the semiconductor die 103 are the die electrical contacts 107. In an alternative embodiment, the die electrical contacts 107 are not formed on any of the plurality of semiconductor dies 103. Thus, each of the semiconductor dies 103 is electrically connected solely through the bonding wires 108 and the substrate electrical contacts 106.

According to the embodiment shown in FIG. 4, the substrates 102 are placed on at least two sides of the semiconductor die 103, each side being adjacent to one side of each of the substrates 102. According to one aspect, the substrates 102 are placed on opposite sides of the semiconductor die 103 as shown in FIG. 4. Alternatively, the substrates 102 may be placed on any two sides of the semiconductor die 103. After the plurality of semiconductor packages 120 are formed, they are cut along singulation lines 131.

Additionally, the substrates 102 and the semiconductor die 103 are coupled using the bonding wires 108 only on the sides of the substrate 102 and the semiconductor die 103 juxtaposed to one another. For example, as seen in FIG. 4, the bonding wires 108 are affixed to the left and right sides of the semiconductor die 103, not the top and bottom sides as shown in FIGS. 1 and 3.

FIG. 4 does not show the encapsulation layer 109. This is done so that the internal structure of the semiconductor package 120 may be shown from a top plan view. Thus, FIG. 4 should not be construed as a complete semiconductor package 120 according to the present disclosure.

Figure 5:
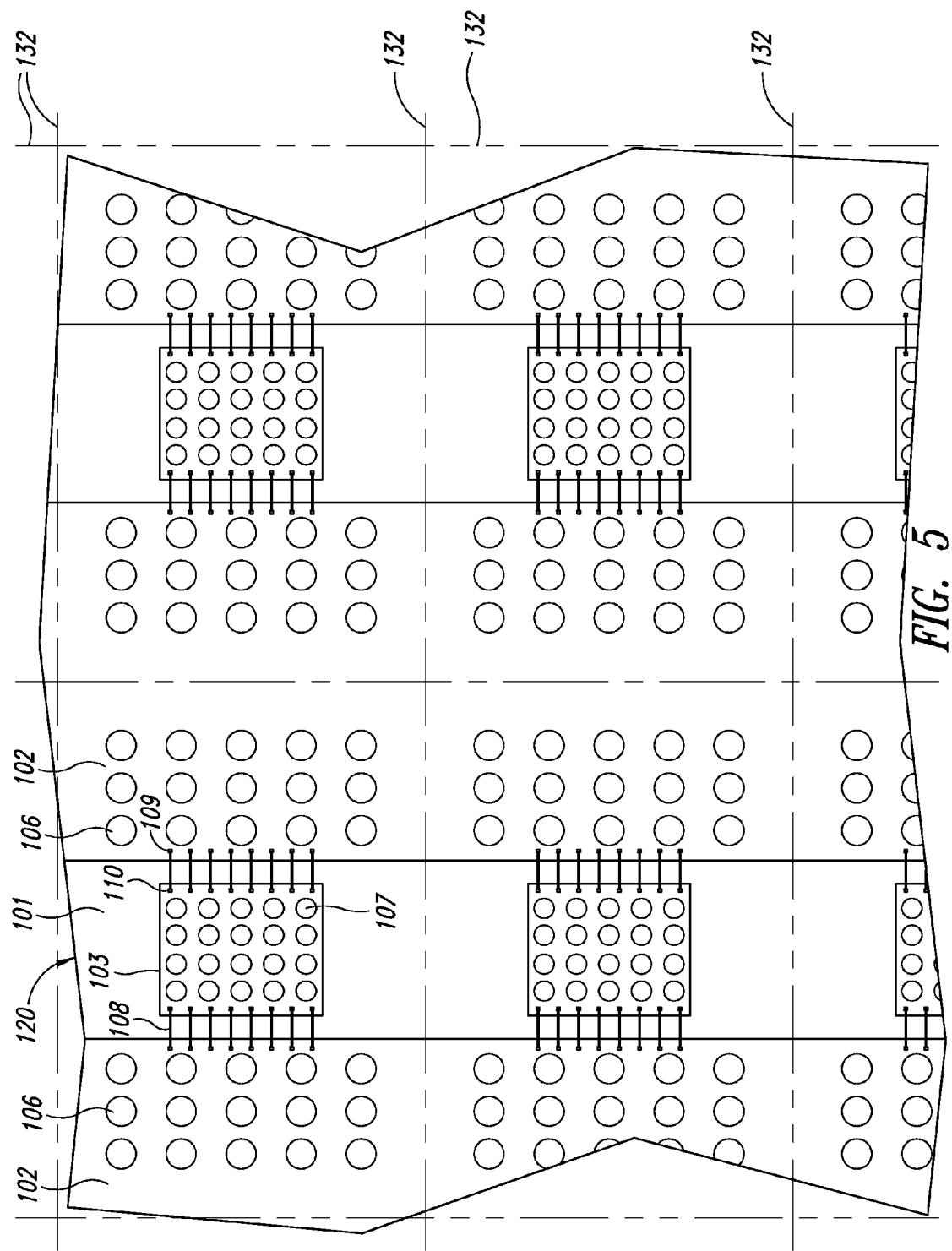
FIG. 5 is a top plan view of a set of circuit assemblies, without the encapsulation layer, according to a third embodiment.

According to another embodiment, FIG. 5 shows a plurality of the semiconductor packages 120 being formed. Each semiconductor package 120 has the thermally conductive layer 101, the substrates 102, the semiconductor die 103, the substrate electrical contacts 106, the die electrical contacts 107, the bonding wires 108, and the contact pads 109, 110. As with FIG. 4, because the substrates 102 are adjacent to only two sides of the semiconductor die 103, there are no substrate electrical contacts 106a. In an alternative embodiment, the die electrical contacts 107 are not formed on each of the plurality of semiconductor dies 103. Thus, each of the semiconductor dies 103 is electrically connected solely through the bonding wires 108 and the substrate electrical contacts 106. Further, after the plurality of semiconductor packages 120 are formed (as discussed with regard to FIGS. 6A-6D), each semiconductor package 120 is cut along singulation lines 132. As with FIG. 4, FIG. 5 does not show the encapsulation layer 109, thus it should not be construed as showing a complete semiconductor package 120 according to the present disclosure.

According to the embodiment shown in FIG. 5, the substrates 102 are made of sheets of substrate material that are affixed onto the thermally conductive layer 101. The semiconductor die 103 is placed on and affixed to the thermally conductive layer 101 in between each of the substrates 102.

Figure 6A:
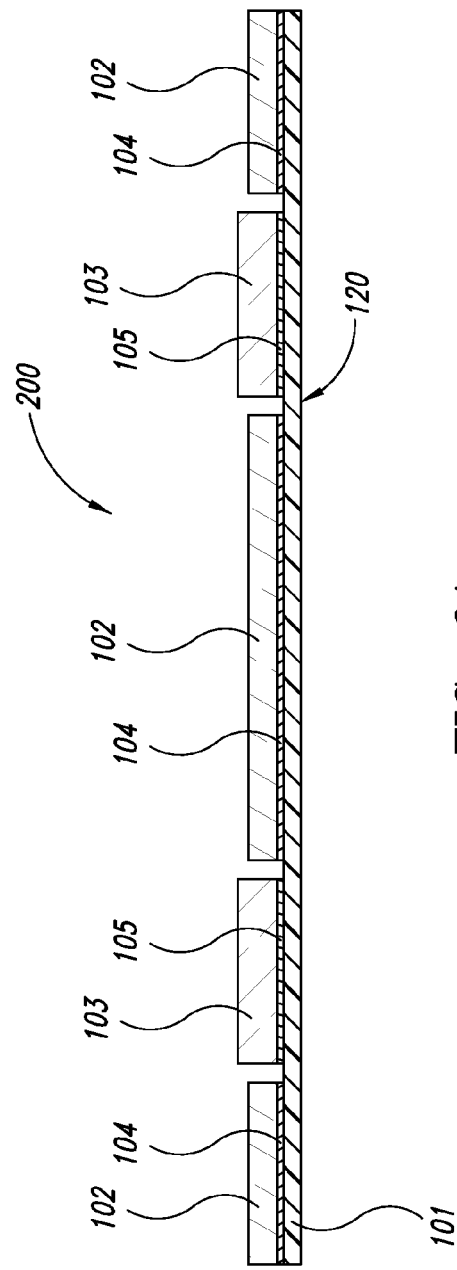
FIG. 6A is a cross-sectional view of a manufacturing process of the semiconductor package according to the disclosure in which a substrate and a semiconductor die are attached to a thermally conductive layer.

As seen in FIGS. 6A-6D, there is shown a process 200 of manufacturing a plurality of semiconductor packages 120 according to the present disclosure. Forming the plurality of semiconductor packages 120 begins, as seen in FIG. 6A, with the thermally conductive layer 101 that has good thermal conductivity properties to dissipate heat from the formed plurality of semiconductor packages 120, and provides rigidity and support during the manufacturing of the plurality of semiconductor packages 120.

As further seen in FIG. 6A, there are substrate adhesive layers 104 and die adhesive layers 105 that are placed on one side of the thermally conductive layer 101. The die adhesive layers 105 are placed in openings on the thermally conductive layer 101 between the substrate adhesive layers 104. As further shown in FIG. 6A, the substrates 102 are placed on the substrate adhesive layers 104 and the semiconductor die 103 are placed on respective die adhesive layers 105. The substrate adhesive layers 104 and the die adhesive layers 105 affix the respective substrates 102 and the semiconductor dies 103 to the thermally conductive layer 101.

According to one embodiment of the present disclosure, the substrate adhesive layers 104 and the die adhesive layers 105 may be the same adhesive material or different adhesive materials. For example, the substrate adhesive layers 104 may be an adhesive tape while the die adhesive layers 105 may be an adhesive glue. Alternatively, the substrate adhesive layers 104 and the die adhesive layers 105 may be the same adhesive material, which may be adhesive tape, adhesive glue, or the like. In a further aspect of the present embodiment, the substrate adhesive layers 104 and the die adhesive layers 105 may be one adhesive layer formed across the thermally conductive layer 101. If the substrate adhesive layers 104 and the die adhesive layers 105 are one adhesive layer, then the thermally conductive layer 101 may not be exposed as seen in FIG. 1.

Figure 6B:
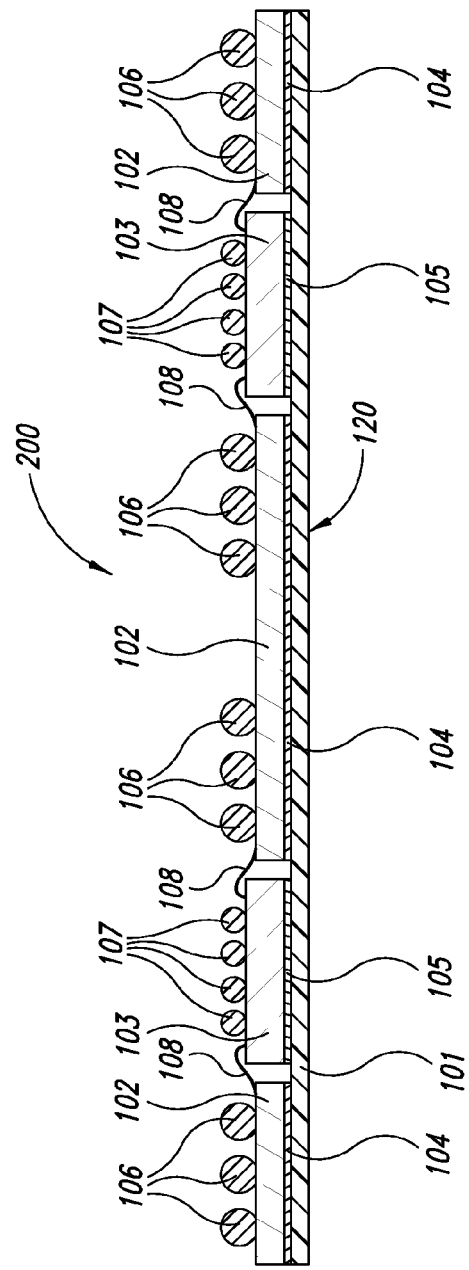
FIG. 6B is a cross-sectional view, taken along lines 6B-6B of FIG. 3, of the manufacturing process of the semiconductor package in which a plurality of electrical contacts are formed on the substrate and the semiconductor die.

After the plurality of semiconductor packages 120 are formed as shown in FIG. 6A, the process 200 of manufacturing continues as seen in FIG. 6B, which is also a cross-sectional view taken from lines 6B-6B in FIG. 3. As the plurality of semiconductor packages 120 is built up from the thermally conductive layer 101, substrate electrical contacts 106 (also the substrate electrical contacts 106a) are formed on the substrates 102. FIG. 6B also shows die electrical contacts 107 formed on the semiconductor dies 103.

In one aspect of the present embodiment, the substrate electrical contacts 106, as well as the die electrical contacts 107, are formed on the substrates 102 and the semiconductor dies 103, respectively, by placing solder balls, or the like, on a solder paste, for example. As previously discussed, the solder paste is used to temporarily hold the electrical contacts in place until further heating or reflow can occur to solder the electrical contacts to the substrates 102 and the semiconductor dies 103. The electrical contacts may also be affixed using various other known methods of electrically connecting components of a semiconductor package.

As further seen in FIG. 6B, there are bonding wires 108 affixed to each of the substrates 102 and to each of the semiconductor dies 103. In one embodiment of the disclosure, the die electrical contacts 107 are affixed to the semiconductor dies 103 to establish a direct electrical connection to another component, such as the PCB 121. In an alternative embodiment, the die electrical contacts 107 are not placed on the plurality of semiconductor packages 120. Accordingly, all electrical signals, including power, that enter and leave the semiconductor dies 103 will be carried over the bonding wires 108 into and out of the substrates 102.

Continuing to build up the plurality of semiconductor packages 120, the process 200 progresses as shown in FIG. 6C. The encapsulating layer 119 is formed over the substrates 102, the semiconductor dies 103, the bonding wires 108, and the substrate electrical contacts 106, as well as the die electrical contacts 107. In one aspect, the encapsulating layer 119 is made of a molding material that is poured, or flows, over the plurality of semiconductor packages 120. According to another aspect, the encapsulating layer 109 completely encloses at least the substrate electrical contacts 106, and the die electrical contacts 107 so that there is an upper surface 110 of the encapsulating layer 119 that is substantially flat and without any protrusions from the underlying electrical contacts 106 or 107.

In an alternative aspect of the present embodiment, the encapsulating layer 119 may not fully enclose the substrate electrical contacts 106, or the die electrical contacts 107, but instead leave a portion of each electrical contact exposed. The bonding wires 108, however, preferably remain fully enclosed by the encapsulating layer 119 to prevent damage to the bonding wires 108 and reduce possible signal degradation through current leakage, increased background interference, or the like.

Even though the encapsulating layer 119 may completely cover the substrate electrical contacts 106, and the die electrical contacts 107, both types of electrical contacts must eventually be exposed to make electrical connections between each of the plurality of semiconductor packages 120 and the outside environment. To expose the substrate electrical contacts 106 and the die electrical contacts 107 to make connection with electrical contacts of a connecting device, such as the PCB 121, the encapsulating layer 119 must be ground down.

In one aspect of the present embodiment, the encapsulating layer 119 is ground down using a grinding technique, such as Chemical Mechanical Polishing or Planarization ("CMP"). Since there are multiple types of materials that make up each of the plurality of semiconductor packages 120, such as the material of the encapsulating layer 119 and the materials of each of the electrical contacts, a grinding technique that results in a substantially flat surface for each material should be chosen. It is desirable to have a substantially flat surface after grinding down upper surface 110 so that each of the plurality of semiconductor packages 120 will properly contact with a connecting device to form a circuit assembly 100 as shown in FIG. 2.

The upper surface 110 of the encapsulating layer 119 is ground down so that the substrate electrical contacts 106 have an exposed surface 112 and the die electrical contacts 107 have an exposed surface 113. Additionally, the upper surface 110 is ground down to a substantially flat surface 114, as seen in FIG. 6D. It is noted that not all flat upper surfaces 112 and 113 have been labeled. This is for clarity in the drawings and does not limit the scope of the present disclosure.

After the encapsulating layer 119 is ground down as seen in FIG. 6D, the plurality of semiconductor packages 120 is singulated at singulation point 115 to create individual semiconductor packages 120. Each semiconductor singulated package 120 is ready to be affixed to an electronic device, such as the PCB 121. According to one embodiment, the semiconductor package 120 is affixed to a respective PCB using a solder reflow process. For example, the PCB electrical contacts 111 may have solder reflow paste placed on the tops of each electrical contact. The semiconductor package 120 is flipped and placed over the top of the PCB 121 so that the PCB electrical contacts 111 align with the substrate electrical contacts 106 and the die electrical contacts 107 of the semiconductor package 120. After the semiconductor package 120 is placed on the PCB 121, a conventional solder reflow process may be performed to permanently affix the semiconductor package 120 to the PCB 121 for use in processing electrical signals.

The various aspects of the disclosure described above may be combined even if not described in such a way. Additionally, although a process for manufacturing a semiconductor package has been described, the steps of manufacture do not necessarily have to happen as described. Various components of the semiconductor package may be assembled in a slightly different order yet still result in the same contemplated semiconductor package as described in the present disclosure.

In general, in the following claims, the terms used should not be construed to limit the claims to specific aspects of the disclosure described in the specification, but should be construed to include all possible aspects along with the full scope of equivalents to which such claims are entitled. Accordingly, the claims are not limited by the disclosure.

The invention claimed is:

1. A semiconductor package comprising:
   a thermally conductive layer;
   at least one substrate affixed to a surface of the thermally conductive layer;
   a semiconductor die affixed to the surface of the thermally conductive layer, the semiconductor die being juxtaposed on at least two sides by the at least one substrate;
   bonding wire electrically coupling the semiconductor die to the at least one substrate; and
   solder balls affixed to the at least one substrate and solder bumps affixed to the semiconductor die, the solder balls of the substrate and the solder bumps of the semiconductor die being substantially coplanar and configured to be mechanically coupled to another electrical device or board.

2. The semiconductor package of claim 1, further comprising:
   an encapsulating layer covering the thermally conductive layer, the at least one substrate, the semiconductor die, and the bonding wires.

3. The semiconductor package of claim 1, wherein the at least one substrate is affixed to the surface of the thermally conductive layer by adhesive tape, and the semiconductor die is affixed to the surface of the conductive layer by adhesive glue.

4. The semiconductor package of claim 1, wherein the thermally conductive layer is a heat sink.

5. A method comprising:
   placing at least one substrate on a surface of a thermally conductive layer;
   placing a semiconductor die on the surface of the thermally conductive layer adjacent the at least one substrate, the semiconductor die being juxtaposed on at least two sides by the at least one substrate; and
   electrically coupling the semiconductor die to the at least one substrate by fixing a first end of a bonding wire to an electrical contact on the semiconductor die and a second end of the bonding wire to an electrical contact on the substrate;
   fixing solder bumps to electrical contacts on the semiconductor die; and
   fixing solder balls to electrical contacts on the at least one substrate, the solder balls of the substrate and the solder bumps of the semiconductor die being substantially coplanar and configured to be mechanically coupled to another electrical device or board.

6. The method of claim 5, further comprising:
   forming an encapsulating layer enclosing the at least one substrate, the semiconductor die, and the bonding wire.

7. The method of claim 5, wherein placing the semiconductor die on the surface of the thermally conductive layer comprises fixing the semiconductor die to the surface by adhesive glue.

8. The method of claim 5, wherein placing the substrate on the surface of the thermally conductive layer comprises fixing the substrate to the surface by adhesive tape.

* * * * *